US009875995B2

United States Patent
Baek et al.

(10) Patent No.: US 9,875,995 B2
(45) Date of Patent: Jan. 23, 2018

(54) STACK CHIP PACKAGE AND METHOD OF MANUFACTURING THE SAME

(71) Applicant: SK hynix Inc., Icheon-si, Gyeonggi-do (KR)

(72) Inventors: Jin Ho Baek, Icheon-si (KR); Il Park, Icheon-si (KR); Ho Kyoon Lee, Icheon-si (KR); Young Pyo Joo, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/174,465

(22) Filed: Jun. 6, 2016

(65) Prior Publication Data
US 2017/0271308 A1    Sep. 21, 2017

(30) Foreign Application Priority Data

Mar. 17, 2016    (KR) .......................... 10-2016-0032030

(51) Int. Cl.
*H01L 25/00* (2006.01)
*H01L 25/065* (2006.01)

(52) U.S. Cl.
CPC .......... *H01L 25/0657* (2013.01); *H01L 25/50* (2013.01); *H01L 2225/06517* (2013.01); *H01L 2225/06527* (2013.01); *H01L 2225/06562* (2013.01); *H05K 2201/09027* (2013.01)

(58) Field of Classification Search
CPC ................................................. H01L 25/0657
See application file for complete search history.

(56) References Cited

U.S. PATENT DOCUMENTS

2009/0001574 A1*    1/2009    Fang ...................... H01L 24/27
257/738

FOREIGN PATENT DOCUMENTS

KR    1020140105971 A    9/2014

OTHER PUBLICATIONS

K S Choi, Recent Trends of Flip Chip Bonding Technology, Electronics and Telecommunications Trends, 2013, pp. 100-110, ETRI.

* cited by examiner

*Primary Examiner* — William Harriston
(74) *Attorney, Agent, or Firm* — William Park & Associates Ltd.

(57) ABSTRACT

A stack chip package may include a plurality of stacked semiconductor chips. Each of the semiconductor chips may have a first node, a second node, a third node and a fourth node corresponding to corners of the semiconductor chip. The plurality of semiconductor chips may be sequentially stacked such that, when a semiconductor chip is disposed directly on another semiconductor chip, the first node of the semiconductor chip is positioned over a side between the first node and the second node of the another semiconductor chip.

18 Claims, 16 Drawing Sheets

STACK CHIP PACKAGE AND METHOD OF MANUFACTURING THE SAME

CROSS-REFERENCES TO RELATED APPLICATION

The present application claims priority under 35 U.S.C. §119(a) to Korean application number 10-2016-0032030 filed on Mar. 17, 2016, in the Korean Intellectual Property Office, which is incorporated herein by reference in its entirety.

BACKGROUND

1. Technical Field

Various embodiments generally relate to a semiconductor package, and more particularly to a stack chip package including a plurality of stacked semiconductor chips, and a method of manufacturing the stack chip package.

2. Related Art

As needs for high-capacity, thin, small semiconductor devices increase, various packaging technologies are being developed. One of the technologies that have made such high-capacity, thin, small semiconductor devices possible is vertically stacking semiconductor chips. Such a stack chip package technology may make it possible for a large number of semiconductor chips having various functions to be integrated in a relatively small area.

With the growing use of portable systems, a reduction in the size of semiconductor products has become more important, and thus a size of a semiconductor package continues to decrease. However, it is important to maintain the reliability of the stacked semiconductor chips while reducing their sizes and increasing their capacity and functions.

SUMMARY

According to an embodiment, there may be provided a stack chip package. The stack chip package may include a plurality of stacked semiconductor chips. Each of the semiconductor chips may have a first node, a second node, a third node and a fourth node corresponding to corners of the semiconductor chip. The plurality of semiconductor chips may be sequentially stacked such that, when a semiconductor chip is disposed directly on another semiconductor chip, the first node of the semiconductor chip is positioned on a side between the first node and the second node of the another semiconductor chip.

According to an embodiment, there may be provided a stack chip package. The stack chip package may include a plurality of stacked semiconductor chips and a printed circuit board (PCB). Each of the semiconductor chips may have a first short side, a second short side facing the first short side, a first long side, a second long side facing the first long side and first to fourth nodes corresponding to intersection points between the first and second short sides and the first and second long sides. The plurality of semiconductor chips may be sequentially stacked such that, when a semiconductor chip is disposed directly on another semiconductor chip, the first node of the semiconductor chip is positioned on the first short side between the first node and the second node of the another semiconductor chip. The PCB may be electrically connected to the semiconductor chips.

According to an embodiment, there may be provided a stack chip package. The stack chip package may include a PCB and first to eighth semiconductor chips. The first to eighth semiconductor chips may be sequentially stacked on the PCB. Each of the first to eighth semiconductor chips may have a rectangular shape including a first short side, a second short side facing the first short side, a first long side, a second long side facing the first long side and first to fourth nodes corresponding to intersection points between the first and second short sides and the first and second long sides. The first to eighth semiconductor chips may be sequentially stacked such that, when a semiconductor chip is disposed directly on another semiconductor chip, among the first to eighth semiconductor chips, the first node of the semiconductor chip is overlapped with the second node of the another semiconductor chip. The PCB may include first to eighth contacts configured to individually make contact with the first to eighth semiconductor chips.

According to an embodiment, there may be provided a method of manufacturing a stack chip package. In the method of manufacturing the stack chip package, a first semiconductor chip may be mounted on a PCB. The first semiconductor chip may include a first short side, a second short side facing the first short side, a first long side, a second long side facing the first long side and first to fourth nodes corresponding to intersection points between the first and second short sides and the first and second long sides. A second semiconductor chip may be stacked on the first semiconductor chip. The second semiconductor chip may include a first short side, a second short side facing the first short side, a first long side, a second long side facing the first long side and first to fourth nodes corresponding to intersection points between the first and second short sides and the first and second long sides. The first node of the second semiconductor chip may be positioned on the first short side of the first semiconductor chip.

DETAILED DESCRIPTION

Figure 1:
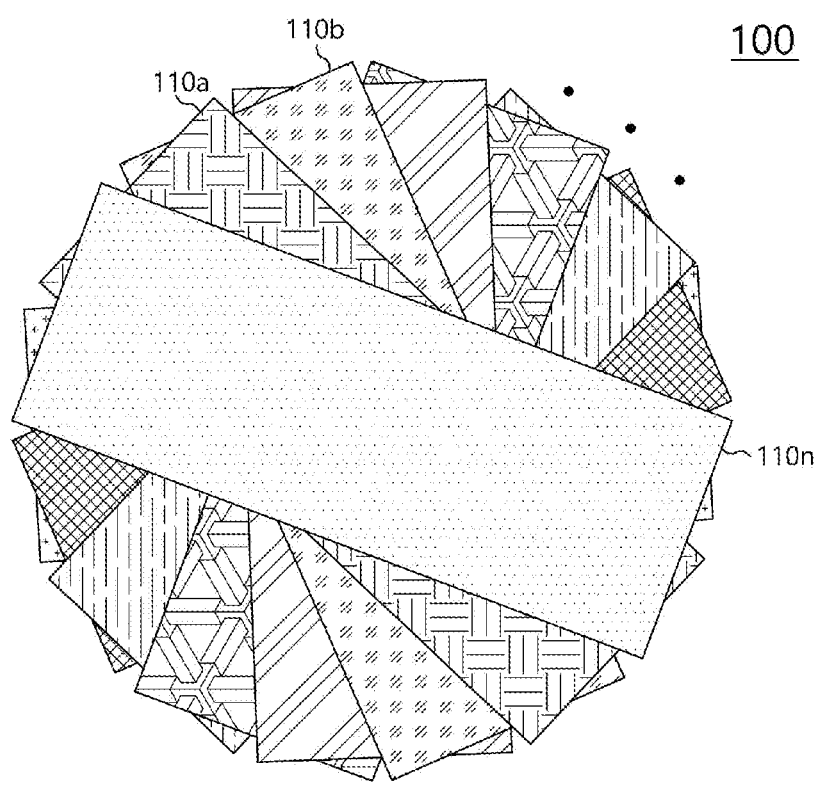
FIG. 1 is a plan view illustrating an example of a stack chip package in accordance with example embodiments.

Various example embodiments will be described hereinafter with reference to the accompanying drawings, in which some examples of the embodiments are illustrated. The embodiments may, however, be embodied in many different forms and should not be construed as limited to the examples of embodiments set forth herein. Rather, these examples of embodiments are provided so that this disclosure will be thorough and complete, and will fully convey a scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "under" other elements or features would then be oriented "above" the other elements or features. Thus, the example of the term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples of embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples of the embodiments will be explained with reference to the accompanying drawings.

FIG. 1 is a plan view illustrating an example of a stack chip package in accordance with example embodiments.

Referring to FIG. 1, a stack chip package 100 may include a plurality of semiconductor chips 110a to 110n. The semiconductor chips 110a to 110n may be stacked such that two adjacent semiconductor chips (i.e., a semiconductor chip and another semiconductor chip disposed on the semiconductor chip) make an acute angle. Examples of the stack chip package 100 in accordance with an embodiment may include a flip chip package. The stacked semiconductor chips 110a to 110n may have chip pads that will be connected to a PCB through conductive bumps (e.g., solder bumps). FIGS. 2 to 9 are plan views illustrating an example method of fabricating a stack chip package in accordance with example embodiments.

In example embodiments, the stack chip package 100 may include first to eighth semiconductor chips 110a to 110h. Further, each semiconductor chip may have a rectangular shape.

Figure 2:
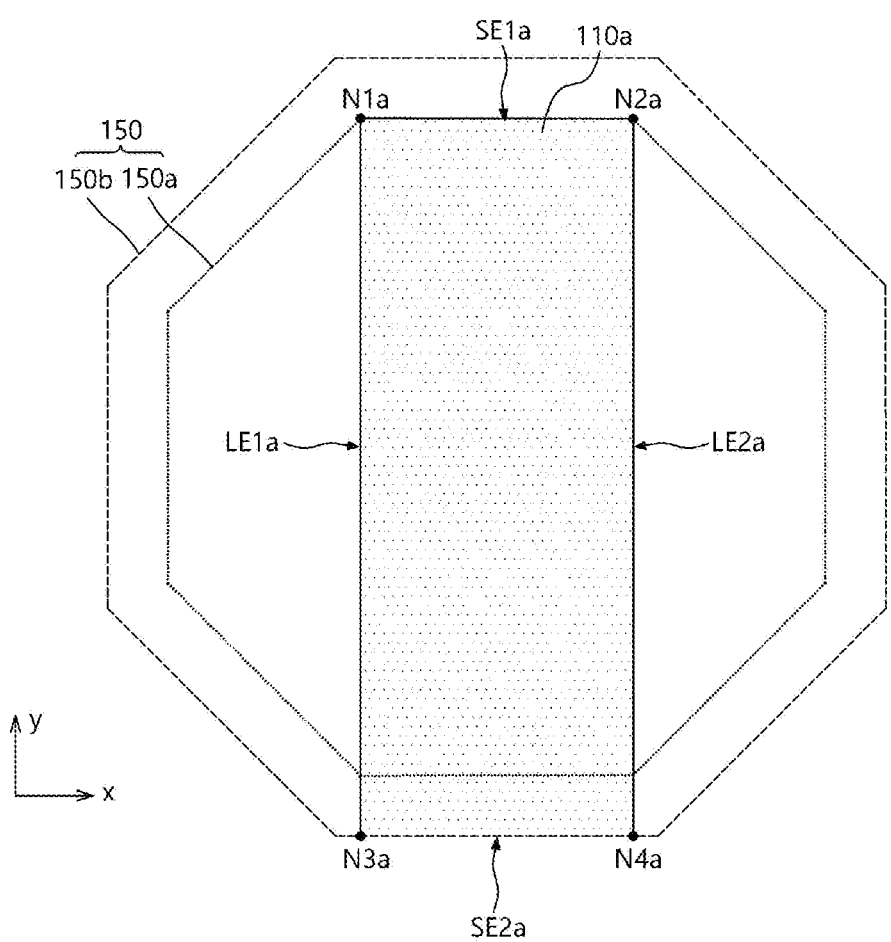
FIGS. 2 to 9 are plan views illustrating an example method of fabricating a stack chip package in accordance with example embodiments.

Referring to FIG. 2, the first semiconductor chip 110a may be mounted on the PCB 150. For example, the first semiconductor chip 110a may have the rectangular shape including a first short side SE1a, a second short side SE2a, and a first long side LE1a and a second long side LE2a. The first and second long sides LE1a and LE2a of the first semiconductor chip 110a may be arranged in parallel. The first and second long sides LE1a and LE2a of the first semiconductor chip 110a may extend in a y-axis direction as illustrated in FIG. 2. The first semiconductor chip 110a may have a first node N1a, a second node N2a, a third node N3a and a fourth node N4a corresponding to intersection points between the first and second short sides SE1a and SE2a and the first and second long sides LE1a and LE2a. That is, the nodes N1a, N2a, N3a and N4a correspond to corners of the first semiconductor chip 110a.

A shape of the PCB 150 may be determined depending on how many semiconductor chips are stacked. In example embodiments, the PCB 150 may have an octagonal columnar shape having an octagonal surface. Hereinafter, the octagonal bottom surface of the PCB 150 may have a first virtual boundary 150a and a second virtual boundary 150b surrounding the first virtual boundary 150a.

The first short side SE1a of the first semiconductor chip 110a may be overlapped with the first virtual boundary 150a of the PCB 150. The second short side SE1b of the first semiconductor chip 110a may be overlapped with the second virtual boundary 150b.

Figure 3:
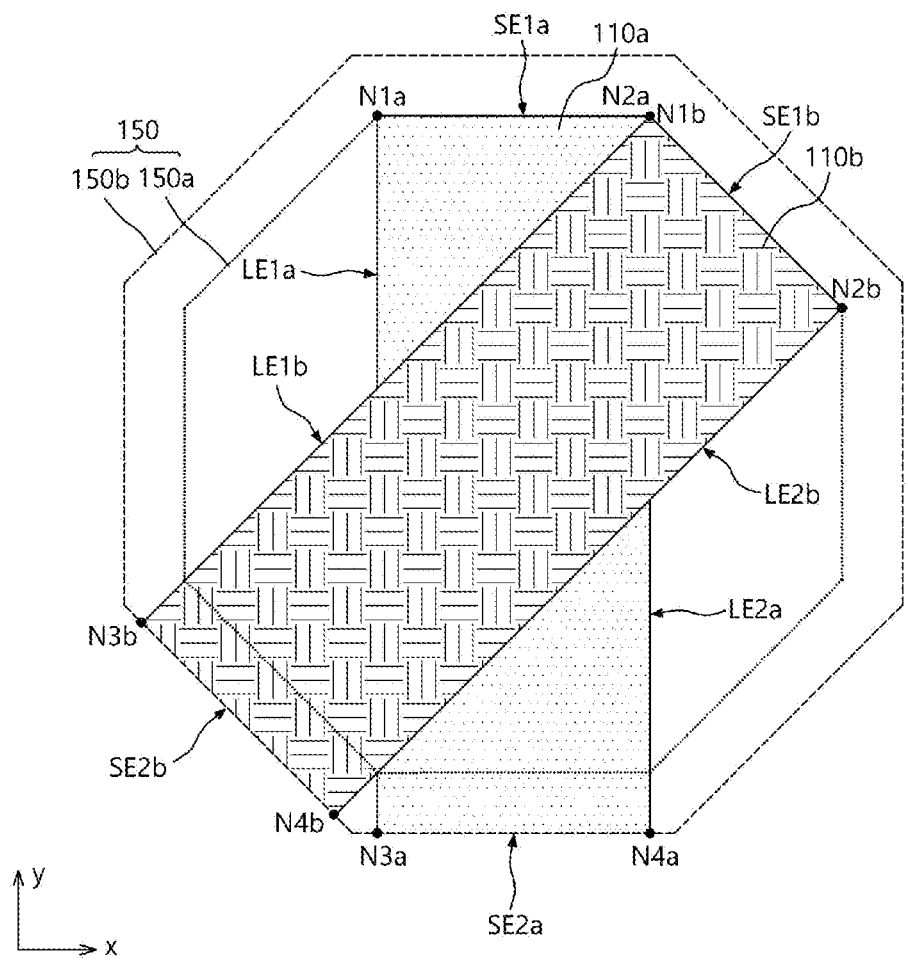

Referring to FIG. 3, the second semiconductor chip 110b may be stacked on the first semiconductor chip 110a. The second semiconductor chip 110b may include a first short side SE1b, a second short side SE2b, a first long side LE1b and a second long side LE2b. The second semiconductor chip 110b may have a first node N1b, a second node N2b, a third node N3b and a fourth node N4b corresponding to intersection points between the first and second short sides SE1b and SE2b and the first and second long sides LE1b and LE2b. The first node N1b of the second semiconductor chip 110b may be positioned over the first short side SE1a of the first semiconductor chip 110a. For example, the first node N1b of the second semiconductor chip 110b may be overlapped with the second node N2a of the first semiconductor chip 110a on the first short side SE1a of the first semiconductor chip 110a. The first short side SE1b of the second semiconductor chip 110b may be positioned over the first virtual boundary 150a. The second short side SE2b of the second semiconductor chip 110b may be positioned over the second virtual boundary 150b.

Figure 4:
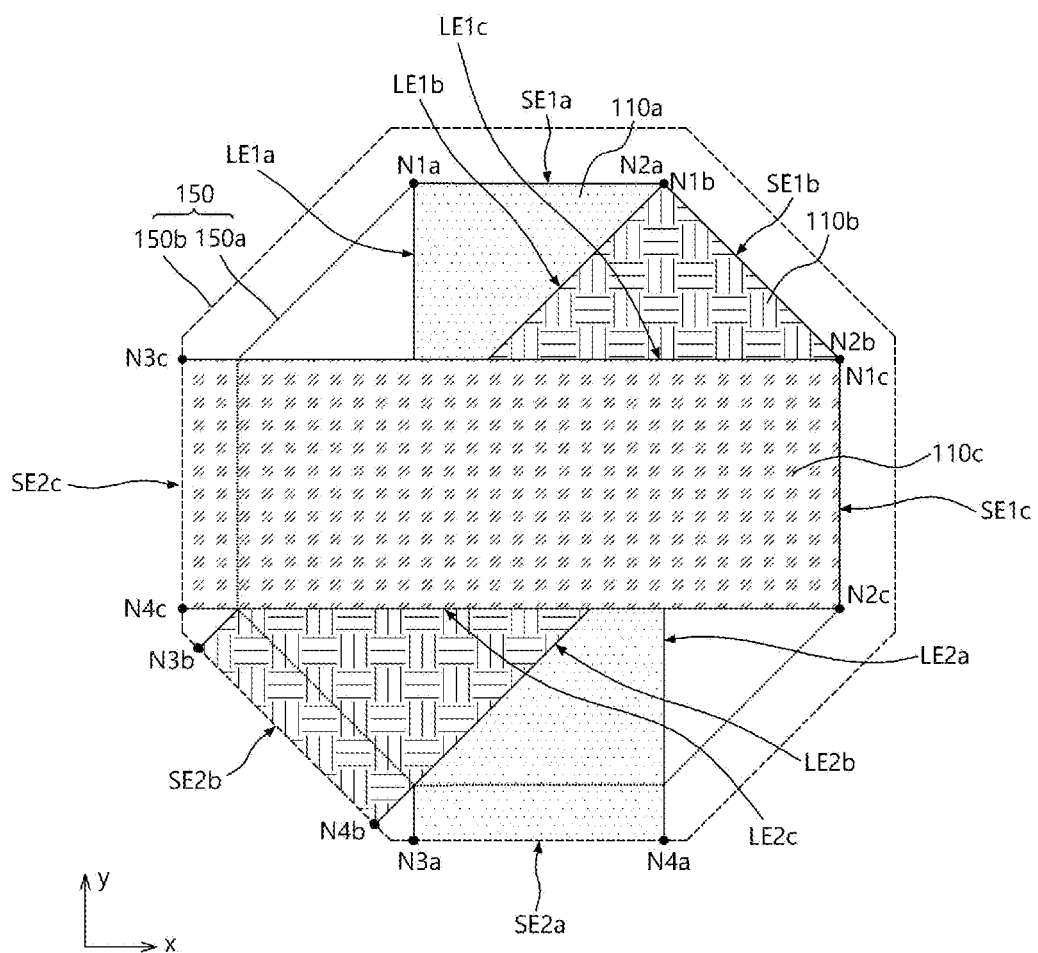

Referring to FIG. 4, the third semiconductor chip 110c may be stacked on the second semiconductor chip 110b. The third semiconductor chip 110c may include a first short side SE1c, a second short side SE2c, a first long side LE1c and a second long side LE2c. The third semiconductor chip 110c may have a first node N1c, a second node N2c, a third node N3c and a fourth node N4c corresponding to intersection points between the first and second short sides SE1c and SE2c and the first and second long sides LE1c and LE2c. The first node N1c of the third semiconductor chip 110c may be overlapped with a point on the first short side SE1b of the second semiconductor chip 110b, for example, the second node N2b of the second semiconductor chip 110b. Further, when viewed from above, the third semiconductor chip 110c may intersect with the first semiconductor chip 110a. The first node N1c of the third semiconductor chip 110c may be overlapped with the second node N2b of the second semiconductor chip 110b. The first short side SE1c of the third semiconductor chip 110c may be overlapped with a side of the first virtual boundary 150a of the PCB 150, and the second short side SE2c of the third semiconductor chip 110c may be overlapped with a side of the second virtual boundary 150b of the PCB 150.

Figure 5:
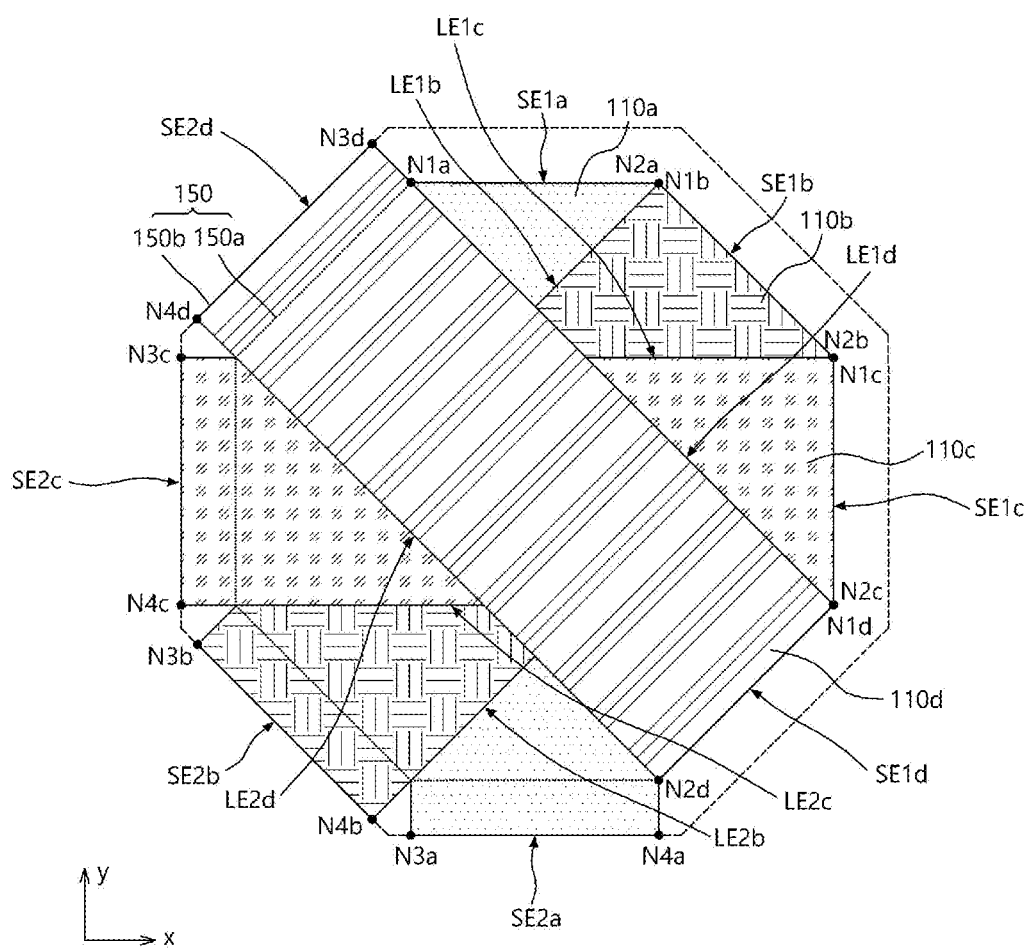

Referring to FIG. 5, the fourth semiconductor chip 110d may be stacked on the third semiconductor chip 110c. The fourth semiconductor chip 110d may include a first short side SE1d, a second short side SE2d, a first long side LE1d and a second long side LE2d. The fourth semiconductor chip 110d may have a first node N1d, a second node N2d, a third node N3d and a fourth node N4d corresponding to intersection points between the first and second short sides SE1d and SE2d and the first and second long sides LE1d and LE2d. The first node N1d of the fourth semiconductor chip 110d may be overlapped with a point on the first short side SE1c of the third semiconductor chip 110c, for example, the second node N2c of the third semiconductor chip 110c. The first short side SE1d of the fourth semiconductor chip 110d may be positioned over the first virtual boundary 150a of the PCB 150. The second short side SE2d of the fourth semiconductor chip 110d may be positioned over the second virtual boundary 150b of the PCB 150. Further, when viewed from above, the fourth semiconductor chip 110d may intersect with the second semiconductor chip 110b.

Figure 6:
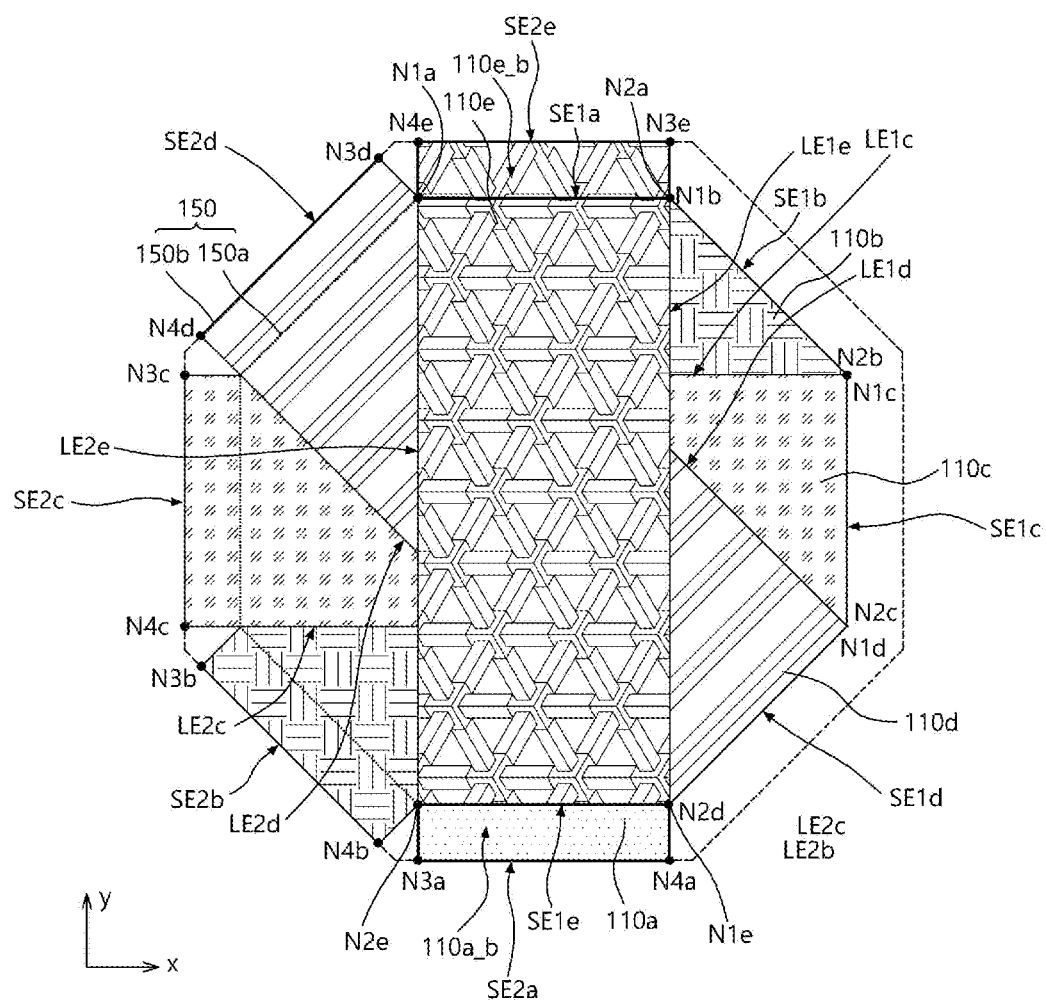

Referring to FIG. 6, the fifth semiconductor chip 110e may be stacked on the fourth semiconductor chip 110d. The fifth semiconductor chip 110e may have configurations substantially the same as those of the first to fourth semiconductor chips 110a, 110b, 110c and 110d. The fifth semiconductor chip 110e may include a first short side SE1e, a second short side SE2e, a first long side LE1e and a second long side LE2e. The fifth semiconductor chip 110e may have a first node N1e, a second node N1e, a third node N3e and a fourth node N4e corresponding to intersection points between the first and second short sides SE1e and SE2e and the first and second long sides LE1e and LE2e. The first node N1e of the fifth semiconductor chip 110e may be overlapped with a point on the first short side SE1d of the fourth semiconductor chip 110d, for example, the second node N2d of the fourth semiconductor chip 110d. The fifth semiconductor chip 110e may be overlapped with the first semiconductor chip 110a in an anti-parallel shape when viewed from above. That is, the fifth semiconductor chip 110e and the first semiconductor chip 110a may extend parallel to each other but with opposite alignments. In addition, the first short side SE1e of the fifth semiconductor chip 110e may be overlapped with the second node N2d of the fourth semiconductor chip 110d. Therefore, the first short side SE1e of the fifth semiconductor chip 110e may be positioned over the first virtual boundary 150a of the PCB 150. The second short side SE2e of the fifth semiconductor chip 110e may be positioned over the second virtual boundary 150b of the PCB 150. A part of the first semiconductor chip 110a (hereinafter, a short side region 110a-b) adjacent to the second short side SE1a of the first semiconductor chip 110a may be exposed from the fifth semiconductor chip 110e. A second short side region 110e-b of the fifth semiconductor chip 110e may be exposed from the first semiconductor chip 110a. The exposed short side regions may be a region that makes contact with the PCB 150 through the conductive bumps. Further, when viewed from above, the fifth semiconductor chip 110e may intersect with the third semiconductor chip 110c.

Figure 7:
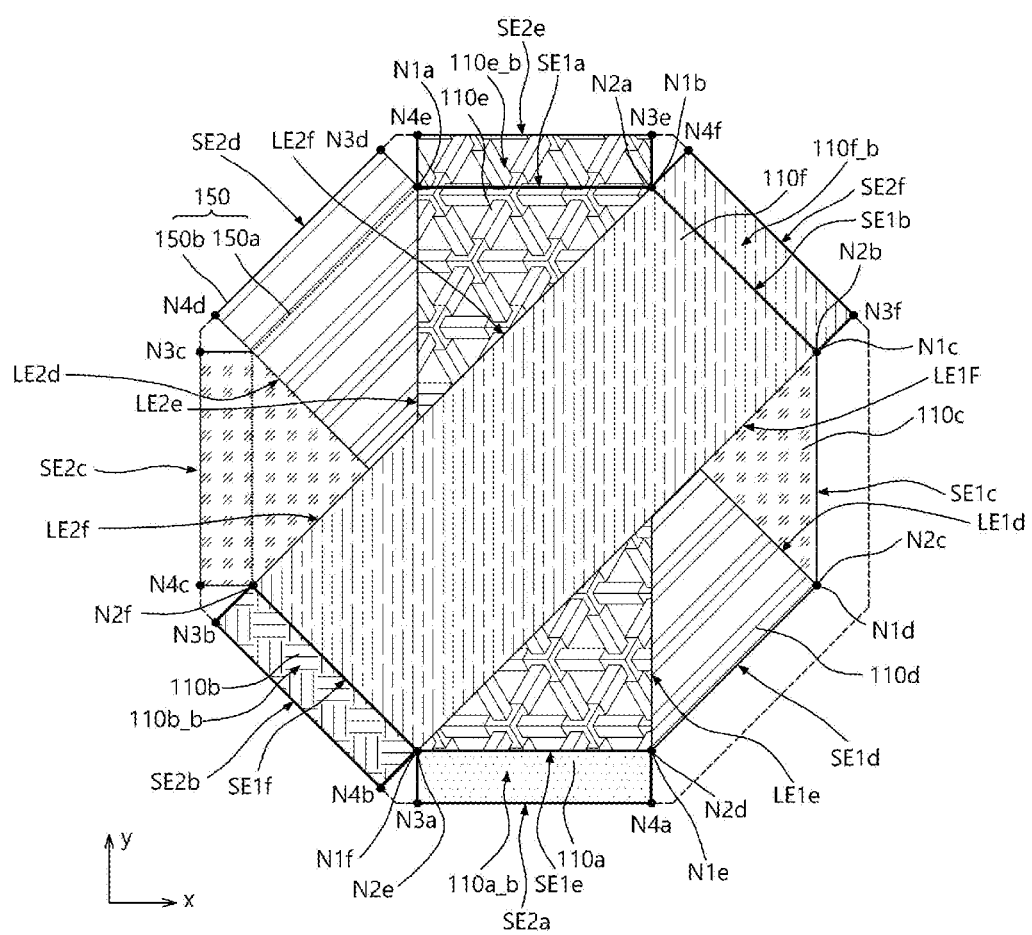

Referring to FIG. 7, theسixth semiconductor chip 110f may be stacked on the fifth semiconductor chip 110e. The sixth semiconductor chip 110f may include a first short side SE1f, a second short side SE2f, a first long side LE1f and a second long side LE2f. The sixth semiconductor chip 110f may have a first node N1f, a second node N2f, a third node N3f and a fourth node N4f corresponding to intersection points between the first and second short sides SE1f and SE2f and the first and second long sides LE1f and LE2f. The first node N1f of the sixth semiconductor chip 110f may be overlapped with a point on the first short side SE1e of the fifth semiconductor chip 110e, for example, the second node N1e of the fifth semiconductor chip 110e. When viewed from above, the sixth semiconductor chip 110f may be overlapped with the second semiconductor chip 110b. The sixth semiconductor chip 110f and the second semiconductor chip 110b may extend parallel to each other but with opposite alignments. When viewed from above, the sixth semiconductor chip 110f may intersect with the fourth semiconductor chip 110d. In addition, the first short side SE1f of the sixth semiconductor chip 110f may be positioned over the first virtual boundary 150a of the PCB 150. The second short side SE2f of the sixth semiconductor chip 110f may be positioned over the second virtual boundary 150b of the PCB 150. Thus, a second short side region 110b-b of the second semiconductor chip 110b may be exposed from the sixth semiconductor chip 110f. A second short side region 110f-b of the sixth semiconductor chip 110f may be exposed from the second semiconductor chip 110b.

Figure 8:
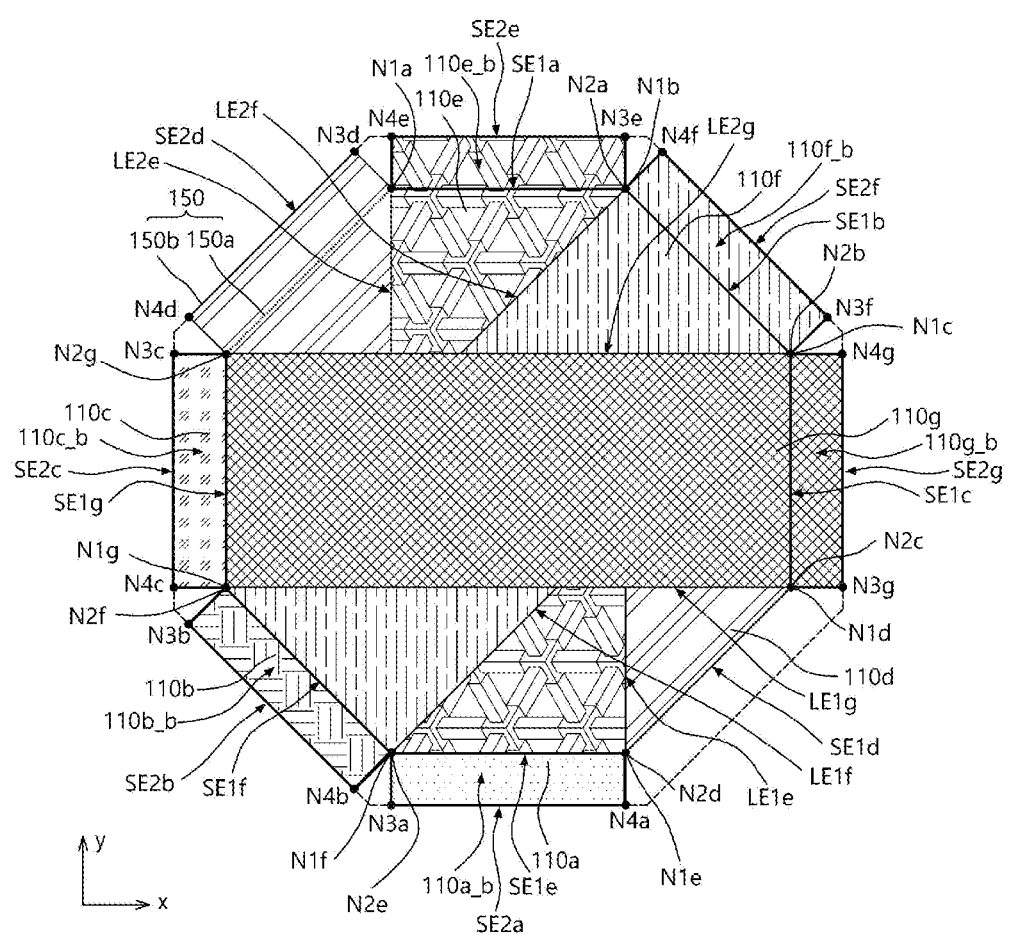

Referring to FIG. 8, the seventh semiconductor chip 110g may be stacked on the sixth semiconductor chip 110f. The seventh semiconductor chip 110g may include a first short side SE1g, a second short side SE2g, a first long side LE1g and a second long side LE2g. The seventh semiconductor chip 110g may have a first node N1g, a second node N2g, a third node N3g and a fourth node N4g corresponding to intersection points between the first and second short sides SE1g and SE2g and the first and second long sides LE1g and LE2g. The first node N1g of the seventh semiconductor chip 110g may be overlapped with a point on the first short side SE1f of the sixth semiconductor chip 110f, for example, the second node N2f of the sixth semiconductor chip 110f. When viewed from above, the seventh semiconductor chip 110g may be overlapped with the third semiconductor chip 110c. The seventh semiconductor chip 110g and the third semiconductor chip 110c may extend parallel to each other but with opposite alignments. When viewed from above, the seventh semiconductor chip 110g may intersect with the first and fifth semiconductor chips 110a and 110e. In addition, the first short side SE1g of the seventh semiconductor chip 110g may be positioned over the first virtual boundary 150a of the PCB 150. The second short side SE2g of the seventh semiconductor chip 110g may be positioned over the second virtual boundary 150b of the PCB 150. Thus, a second short side region 110c-b of the third semiconductor chip 110c may be exposed from the seventh semiconductor chip 110g. A second short side region 110g-b of the seventh semiconductor chip 110g may be exposed from the third semiconductor chip 110c.

Figure 9:
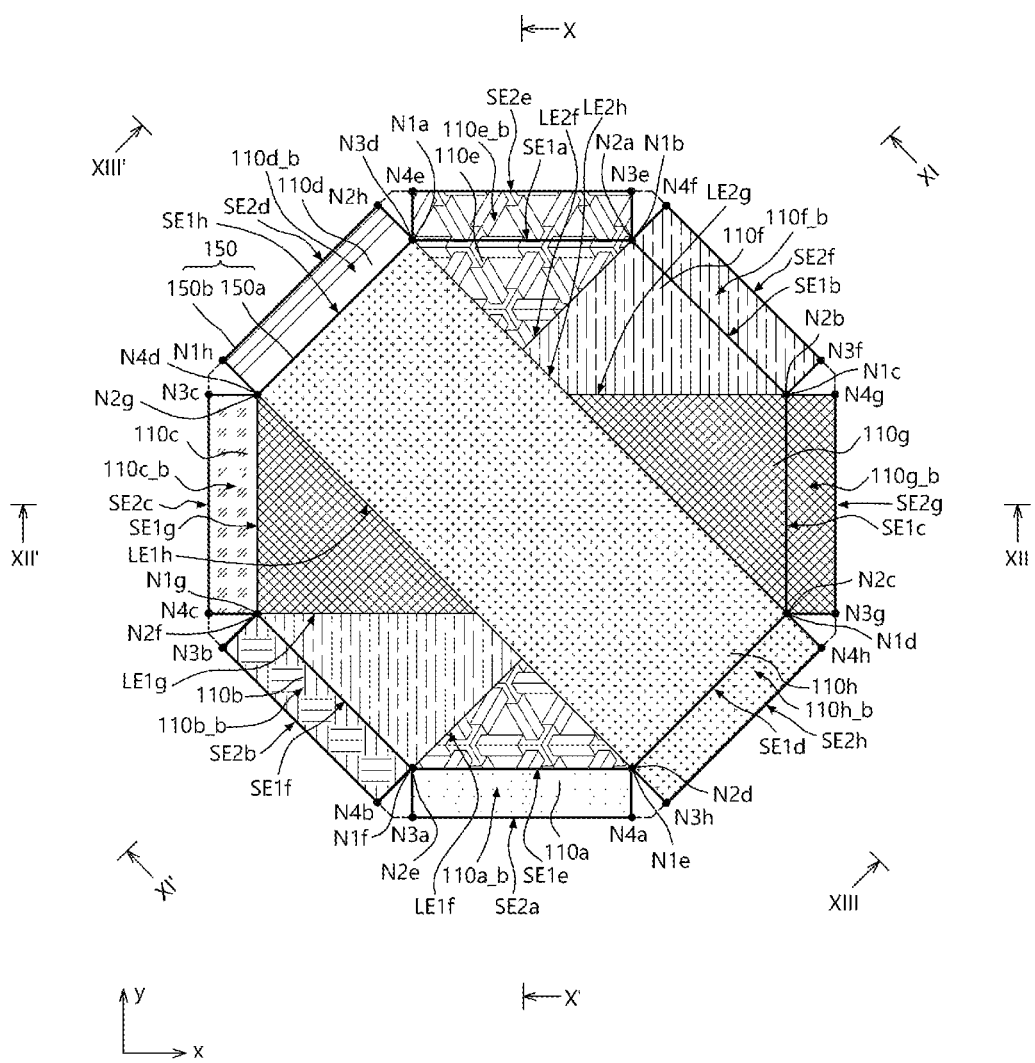

Referring to FIG. 9, the eighth semiconductor chip 110h may be stacked on the seventh semiconductor chip 110g. The eighth semiconductor chip 110h may include a first short side SE1h, a second short side SE2h, a first long side LE1h and a second long side LE2h. The eighth semiconductor chip 110h may have a first node N1h, a second node N2h, a third node N3h and a fourth node N4h corresponding to intersection points between the first and second short sides SE1h and SE2h and the first and second long sides LE1h and LE2h. The first node N1h of the eighth semiconductor chip 110h may be overlapped with a point on the first short side SE1g of the seventh semiconductor chip 110g, for example, the second node N2g of the seventh semiconductor chip 110g. When viewed from above, the eighth semiconductor chip 110h may be overlapped with the fourth semiconductor chip 110d. The eighth semiconductor chip 110h and the fourth semiconductor chip 110d may extend parallel to each other but with opposite alignments. When viewed from above, the eighth semiconductor chip 110h may intersect with the second and sixth semiconductor chips 110b and 110f. The eighth semiconductor chip 110h may be disposed such that the eighth semiconductor chip 110h and the seventh semiconductor chip 110g make an acute angle, and the first short side SE1h of the eighth semiconductor chip 110h may be positioned over the first virtual boundary 150a of the PCB 150. The second short side SE2h of the eighth semiconductor chip 110h may be positioned over the second virtual boundary 150b of the PCB 150. Thus, a second short side region 110d-b of the fourth semiconductor chip 110d may be exposed from the eighth semiconductor chip 110h. A second short side region 110h-b of the eighth semiconductor chip 110h may be exposed from the fourth semiconductor chip 110d.

In an embodiment, the semiconductor chips 110a to 110h may be disposed such that adjacent two semiconductor chips (i.e., a semiconductor chip and another semiconductor chip disposed on the semiconductor chip) make an acute angle, and may be disposed such that a node selected between the nodes made by the semiconductor chips 110a to 110h may be located over a short side connected to the selected node. Further, the semiconductor chips 110a to 110h may be stacked in this way by making a predetermined node overlap a predetermined short side.

Figure 10:
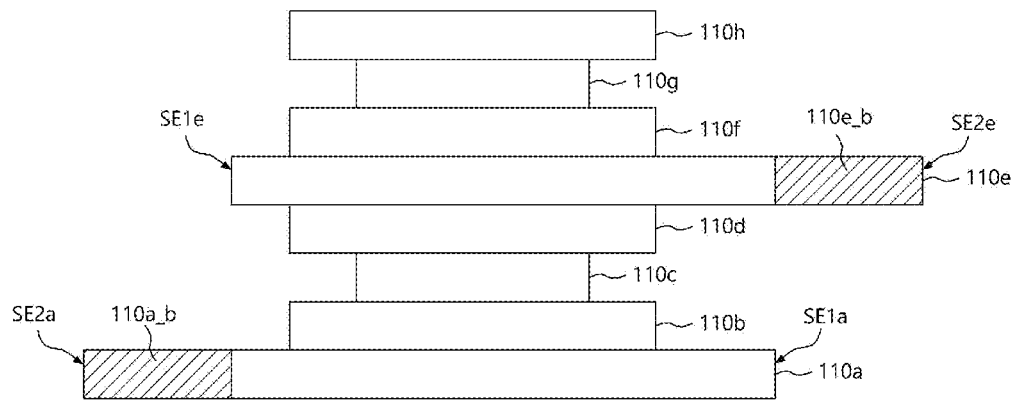
FIG. 10 is a cross-sectional view taken along a line X-X' in FIG. 9.

FIG. 10 is a cross-sectional view taken along a line X-X' in FIG. 9.

Referring to FIG. 10, the first to eighth semiconductor chips 110a to 110h may be sequentially stacked by a bonding process. The first semiconductor chip 110a and the fifth semiconductor chip 110e may be stacked in parallel to each other but with opposite alignments. The second short side region 110a-b of the first semiconductor chip 110a may protrude compared to the first short side SE1e of the fifth semiconductor chip 110e. The second short side region 110e-b of the fifth semiconductor chip 110e may protrude compared to the first short side SE1a of the first semiconductor chip 110a.

Figure 11:
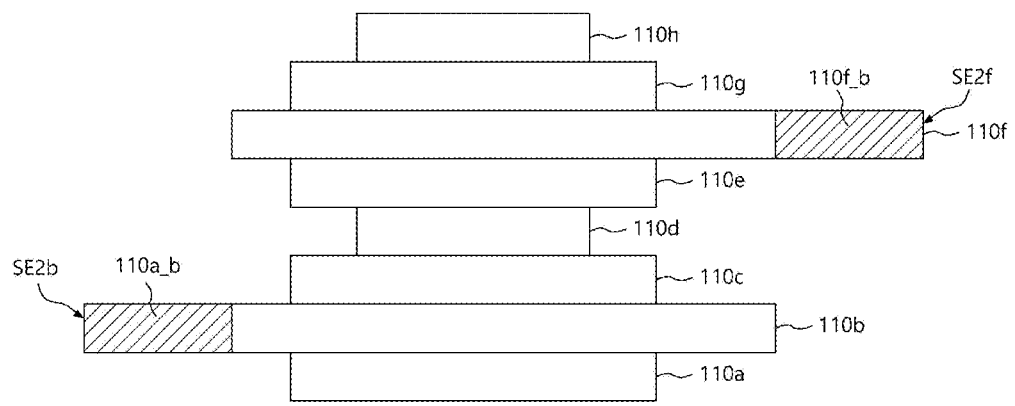
FIG. 11 is a cross-sectional view taken along a line XI-XI' in FIG. 9.

FIG. 11 is a cross-sectional view taken along a line XI-XI' in FIG. 9.

Referring to FIG. 11, the second semiconductor chip 110b and the sixth semiconductor chip 110e may be stacked in parallel to each other but with opposite alignments. The second short side region 110b-b of the second semiconductor chip 110b may protruded compared to the first short side SE1f of the sixth semiconductor chip 110f. The second short side region 110f-b of the sixth semiconductor chip 110f may protruded compared to the first short side SE1b of the second semiconductor chip 110b.

Figure 12:
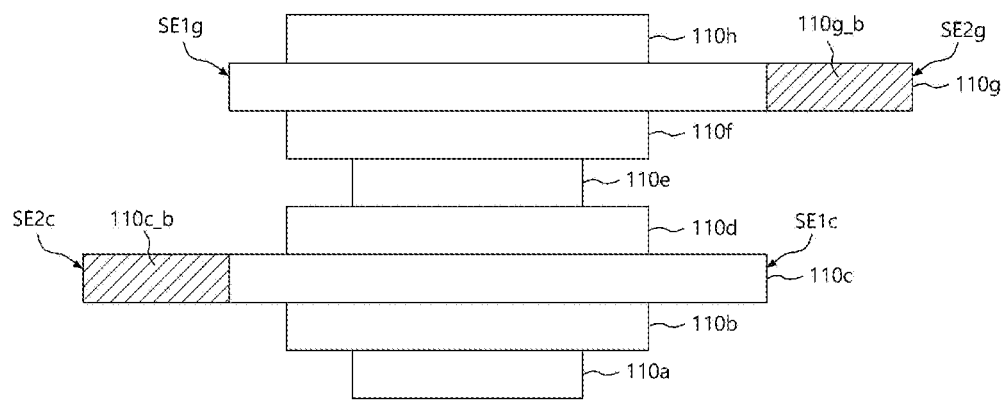
FIG. 12 is a cross-sectional view taken along a line XII-XII' in FIG. 9.

FIG. 12 is a cross-sectional view taken along a line XII-XII' in FIG. 9.

Referring to FIG. 12, the third semiconductor chip 110c and the seventh semiconductor chip 110g may be stacked in parallel to each other but with opposite alignments. The second short side region 110c-b of the third semiconductor chip 110c may protrude compared to the first short side SE1g of the seventh semiconductor chip 110g. The second short side region 110g-b of the seventh semiconductor chip 110g may protrude compared to the first short side SE1c of the third semiconductor chip 110c.

Figure 13:
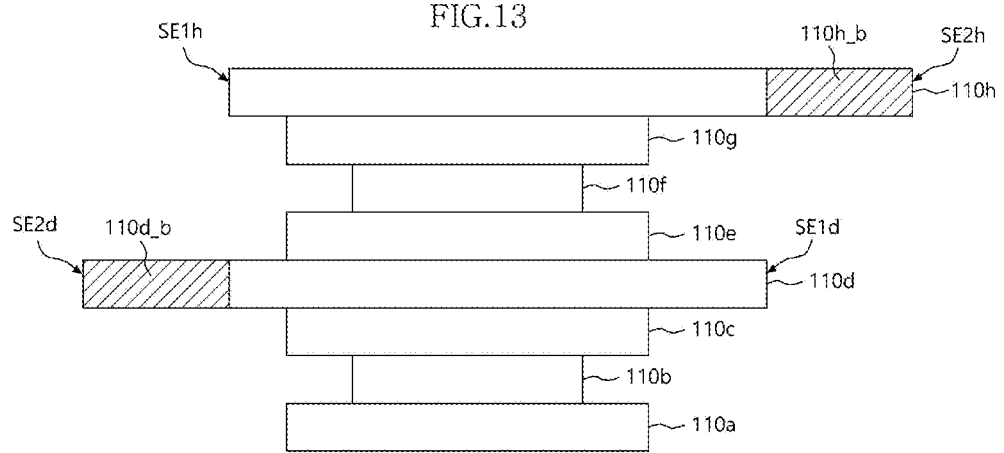
FIG. 13 is a cross-sectional view taken along a line XIII-XIII' in FIG. 9.

FIG. 13 is a cross-sectional view taken along a line XIII-XIII' in FIG. 9.

Referring to FIG. 13, the fourth semiconductor chip 110d and the eighth semiconductor chip 110h may be stacked in parallel to each other but with opposite alignments. The second short side region 110d-b of the fourth semiconductor chip 110d may protrude compared to the first short side SE1h of the eighth semiconductor chip 110h. The second short side region 110h-b of the eighth semiconductor chip 110h may protrude compared to the first short side SE1d of the fourth semiconductor chip 110d.

The protruding second short side regions 110a-b to 110h-b of the semiconductor chips 110a to 110h may be a contact region that makes contact with the PCB 150. A plurality of contact pads (not illustrated) may be arranged in the protruding second short side regions 110a-b to 110h-b. Circuits in the semiconductor chips 110a to 110h may be electrically connected to the contact pads in the second short side regions 110a-b to 110h-b through redistribution layers (not illustrated).

Figure 14:
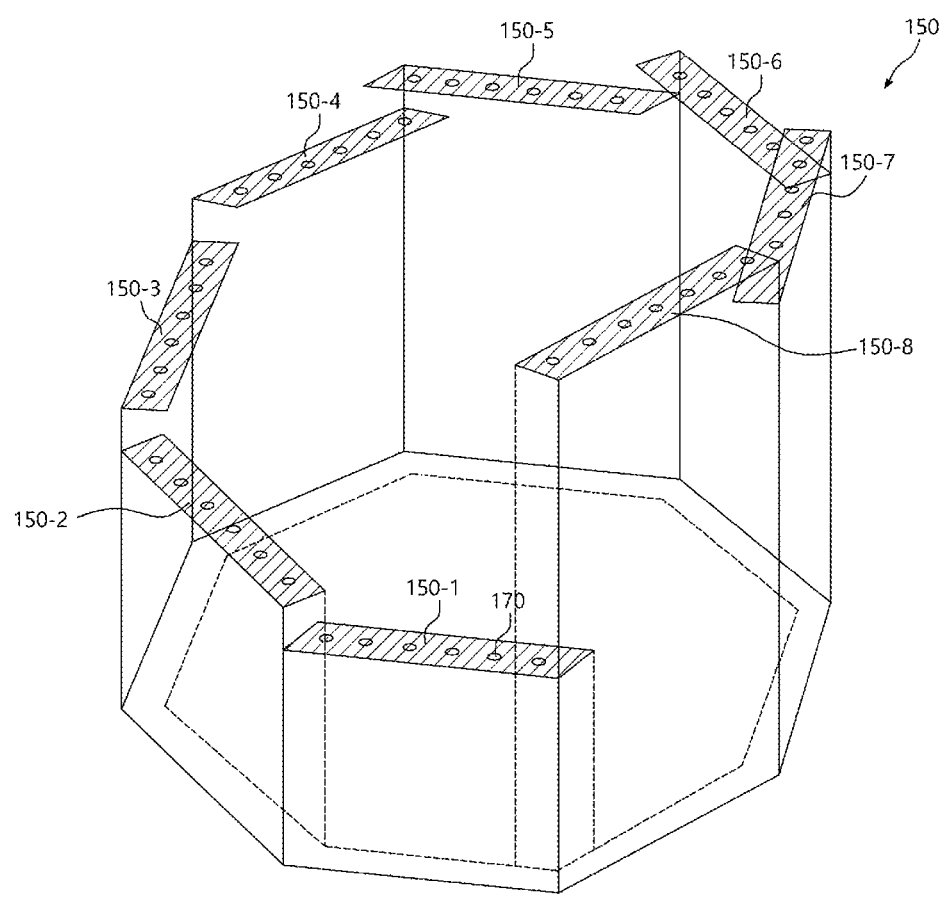
FIG. 14 is a perspective view illustrating an example of a PCB in accordance with example embodiments.

FIG. 14 is a perspective view illustrating an example of a PCB in accordance with example embodiments.

Referring to FIG. 14, the PCB 150 may have an octagonal columnar shape having an open upper surface. Each of eight side surfaces of the PCB 150 may include contacts 150-1 to 150-8 that will make contact with the eight semiconductor chips 110a to 110h. The first to eight contacts 150-1 to 150-8 may have a stepped structure corresponding to a stack height of the semiconductor chips 110a to 110h.

The first contact 150-1 may be arranged at one of the eight side surfaces of the PCB 150. For example, the first contact 150-1 may be formed by bending an upper surface of the side surface inwardly toward a central portion of the PCB 150. The first contact 150-1 may be positioned on a lowermost horizontal plane among horizontal planes on which the first to eighth contacts 150-1 to 150-8 are positioned. Thus, the first contact 150-1 may be electrically connected to the second short side region 110a-b of the lowermost first semiconductor chip 110a in the stack chip package. In order to form the flip chip package, a bottom surface of the second short side region 110a-b of the first semiconductor chip 110a may be electrically connected to the first contact 150-1 through a plurality of conductive bumps 170.

The second contact 150-2 may be arranged at the side surface adjacent to the first contact 150-1. The second contact 150-2 may be formed by bending an upper surface of the side surface inwardly toward the central portion of the PCB 150. The second contact 150-2 may be positioned on a horizontal plane higher than the horizontal plane where the first contact 150-1 is positioned. For example, the horizontal plane on which the second contact 150-2 is positioned may be higher than the horizontal plane on which the first contact 150-1 is positioned by a thickness of the first semiconductor chip 110$a$. The second contact 150-2 may be electrically connected to the second short side region 110$b$-$b$ of the second semiconductor chip 110$b$.

The third to eighth contacts 150-3 to 150-8 may be arranged in the stepped shape by the thickness of the semiconductor chip. Further, the third to eighth contacts 150-3 to 150-8 may be electrically connected to the short side regions of the semiconductor chips.

The first to eighth contacts 150-1 to 150-8 may include bump pads in contact regions to make contact with the conductive bumps. Electrical signals applied to the PCB 150 may be transmitted to the conductive pads of the semiconductor chips 110$a$ to 110$h$ through the bump pads and the conductive bumps.

The PCB 150 having the octagonal columnar shape may have a bottom outer surface corresponding to the second virtual boundary 150$b$. Lines projected from inner surfaces of the contacts 150-1 to 150-8 to the bottom surface of the PCB 150 may correspond to the first virtual boundary 150$a$.

The second short side SE2$a$ to SE2$h$ of the first to eighth semiconductor chips 110$a$ to 110$h$ may protrude from the stacked semiconductor chips. Thus, because the protruding second short sides SE2$a$ to SE2$h$ may be positioned on the different horizontal planes, the protruding second short sides SE2$a$ to SE2$h$ may not be electrically connected to each other.

Further, the height difference between the second short sides SE2$a$ to SE2$h$ of the semiconductor chips 110$a$ to 110$h$ may make it possible that the semiconductor chips 110$a$ to 110$h$ may be mounted on the PCB 150, which includes the contacts 150-1 to 150-8, by using a flip chip interconnection.

In example embodiments, the contacts 150-1 to 150-8 and the second short sides SE2$a$ to SE2$h$ may have the rectangular shapes. Alternatively, shapes of the contacts 150-1 to 150-8 and the second short sides SE2$a$ to SE2$h$ may be changed in accordance with sizes of the semiconductor chips.

FIGS. 15 to 18 are cross-sectional views illustrating an example of a stack chip package mounted on a package substrate along directions.

Figure 15:
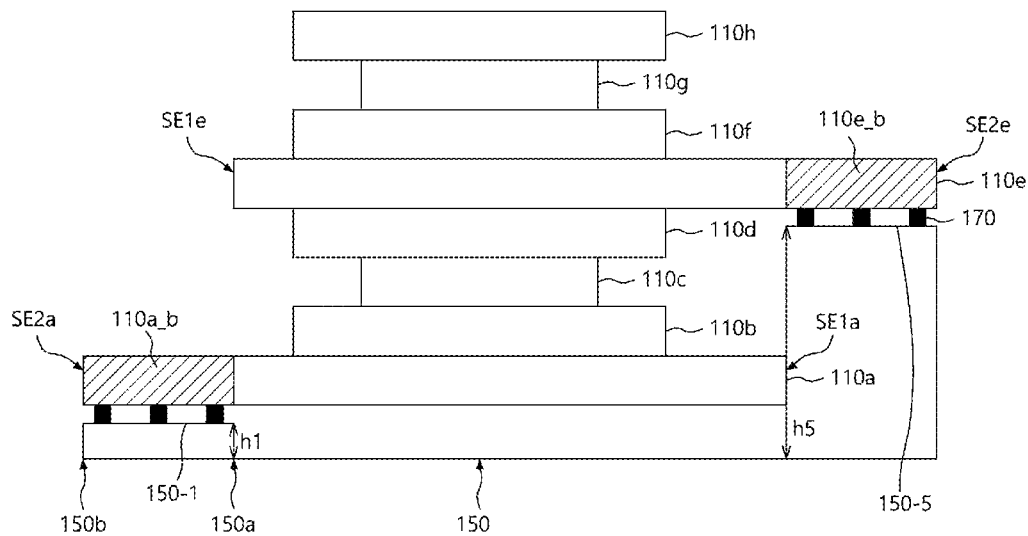
FIGS. 15 to 18 are cross-sectional views illustrating an example of a stack chip package mounted on a PCB along directions.

Referring to FIG. 15, the first contact 150-1 may be electrically connected to the second short side region 110$a$-$b$ of the first semiconductor chip 110$a$ through an external connection terminal such as the conductive bump 170. The fifth contact 150-5 may be electrically connected to the second short side region 110$e$-$b$ of the fifth semiconductor chip 110$e$ through the conductive bump 170.

Figure 16:
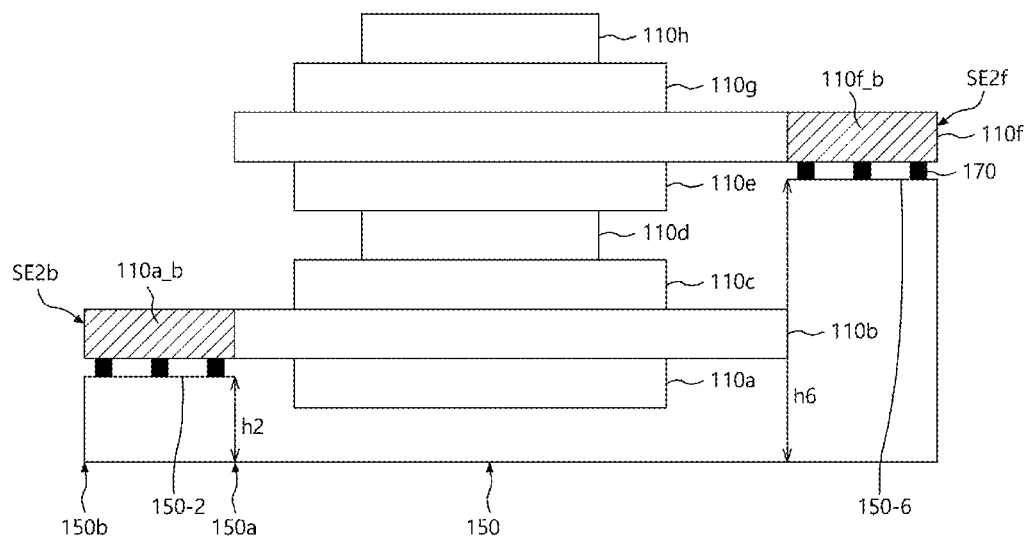

Referring to FIG. 16, the second contact 150-2 may be electrically connected to the second short side region 110$b$-$b$ of the second semiconductor chip 110$b$ through the conductive bump 170. The sixth contact 150-6 may be electrically connected to the second short side region 110$f$-$b$ of the sixth semiconductor chip 110$f$ through the conductive bump 170.

Figure 17:
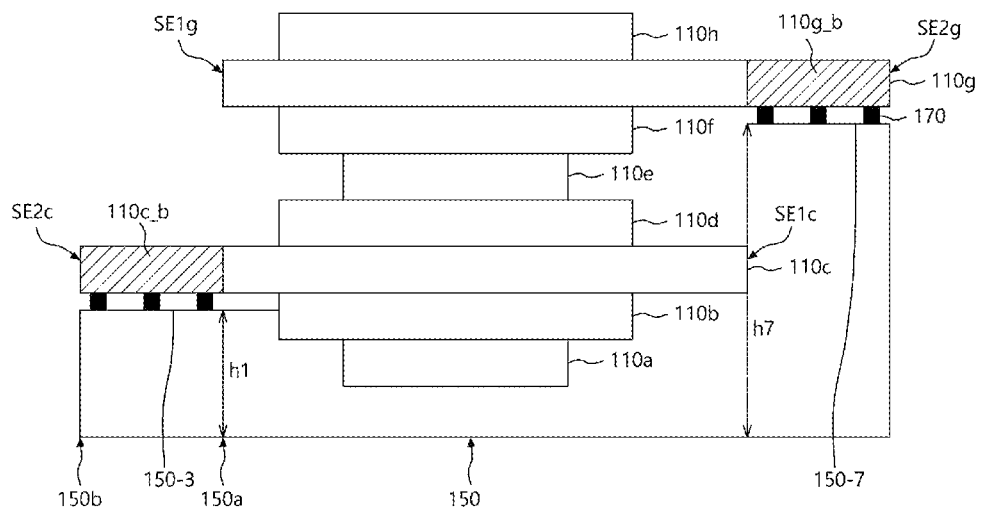

Referring to FIG. 17, the third contact 150-3 may be electrically connected to the second short side region 110$c$-$b$ of the third semiconductor chip 110$c$ through the conductive bump 170. The seventh contact 150-7 may be electrically connected to the second short side region 110$g$-$b$ of the seventh semiconductor chip 110$g$ through the conductive bump 170.

Figure 18:
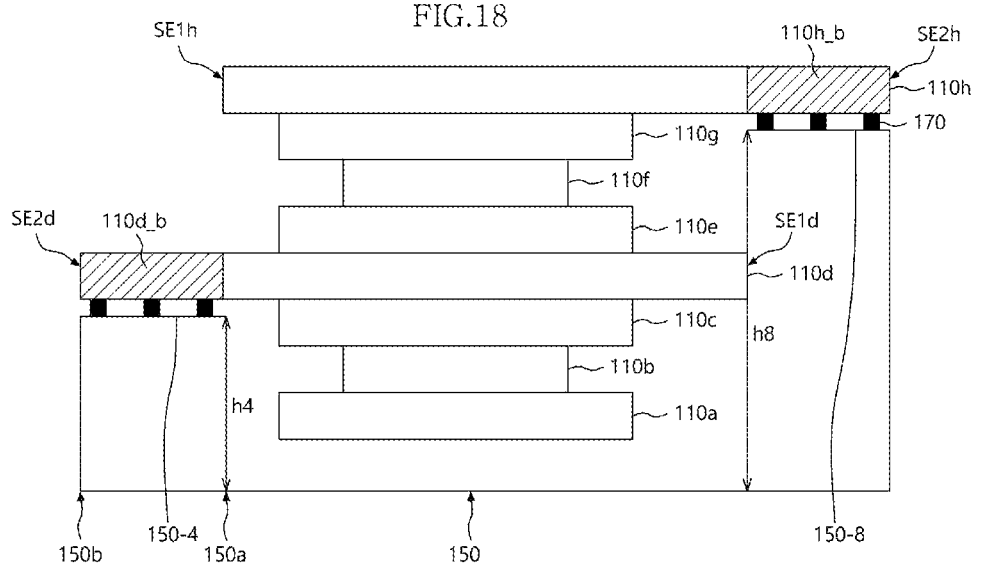

Referring to FIG. 18, the fourth contact 150-4 may be electrically connected to the second short side region 110$d$-$b$ of the fourth semiconductor chip 110$d$ through the conductive bump 170. The eighth contact 150-8 may be electrically connected to the second short side region 110$h$-$b$ of the eighth semiconductor chip 110$h$ through the conductive bump 170.

Referring to FIGS. 15 to 18, the first contact 150-1 may be spaced apart from the bottom surface of the PCB 150 by a first height h1. The second contact 150-2 may be spaced apart from the bottom surface of the PCB 150 by a second height h2. The third contact 150-3 may be spaced apart from the bottom surface of the PCB 150 by a third height h3. The fourth contact 150-4 may be spaced apart from the bottom surface of the PCB 150 by a fourth height h4. The fifth contact 150-5 may be spaced apart from the bottom surface of the PCB 150 by a fifth height h5. The sixth contact 150-6 may be spaced apart from the bottom surface of the PCB 150 by a sixth height h6. The seventh contact 150-7 may be spaced apart from the bottom surface of the PCB 150 by a seventh height h7. The eighth contact 150-8 may be spaced apart from the bottom surface of the PCB 150 by an eighth height h8. A height difference between the adjacent contacts may be identical or similar to the thickness of the semiconductor chip.

According to example embodiments, the sequentially stacked semiconductor chips may be arranged such that adjacent two semiconductor chips (i.e., a semiconductor chip and another semiconductor chip disposed on the semiconductor chip) make an acute angle. The node corresponding to the first corner of the upper semiconductor chip may be positioned over the short side of the lower semiconductor chip. Therefore, the edge regions of the stacked semiconductor chips may be exposed so that the semiconductor chips may be mounted on the PCB and electrically connected thereto using the flip chip interconnection.

In this way, a large number of semiconductor chips may be assembled into a single package (i.e., multi-chip package) without using a complicated wire bonding process. In addition, the stack chip package in accordance with an embodiment may be fabricated at a low cost, and may improve electrical reliability.

In example embodiments, the stack chip package may include semiconductor chips of the same size and the same kind. Alternatively, the stack chip package of example embodiments may include semiconductor chips of different sizes and different kinds.

Figure 19:
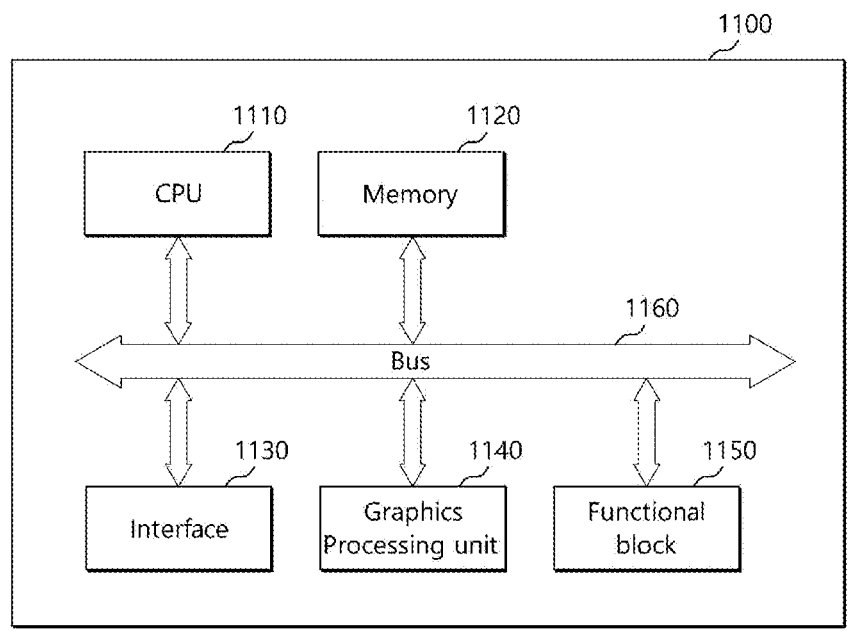
FIG. 19 is a block diagram illustrating examples of elements of a chip-stacked package according to an example embodiment of the inventive concepts.

FIG. 19 is a block diagram illustrating examples of elements of a chip-stacked package according to an example embodiment of the inventive concepts.

Examples of a chip-stacked package 1100 may include a system-on-chip (SoC). The chip-stacked package 1100 may include a central processing unit (CPU) 1110 (e.g., a controller chip), a memory 1120 (e.g., a memory chip), an interface 1130, a graphics processing unit 1140, functional blocks 1150, and a bus 1160. The CPU 1110, the memory 1120, the interface 1130, the graphics processing unit 1140, and the functional blocks 1150 may communicate with each other through the bus 1160. The CPU 1110 may control an operation of the SoC, (e.g., an operation of the chip-stacked package 1100). The CPU 1110 may include, for example, a core and an L2 cache. The CPU 1110 may include multi-cores. The multi-cores each may have the same or different functions. The multi-cores may be activated at the same time or at different timings.

The memory 1120 may store a processing result of the functional blocks 1150 under the control of the CPU 1110. For example, as data that is stored in the L2 cache of the CPU 1110 is flushed, the data (e.g., the processing result) may be stored in the memory 1120.

The interface 1130 may interface with external devices. For example, the interface 1130 may interface with, for example, a camera, a liquid crystal display (LCD), and a speaker. The graphics processing unit 1140 may perform graphics operations that are requested by the SoC. For example, the graphics processing unit 1140 may perform, for example, video codec or 3D graphics operations. The functional blocks 1150 may perform various functions that are requested by the SoC. For example, when the chip-stacked package 1100 is an application processor (AP) that is used in a mobile device, some of the functional blocks 1150 may perform a communication function. The chip stacked package 1100 may include structures according to an embodiments. The CPU 1110 may include the stack chip package 100 of FIGS. 1 and 18. The memory 1120 may include the stack chip package 100 of FIGS. 1 and 18.

Figure 20:
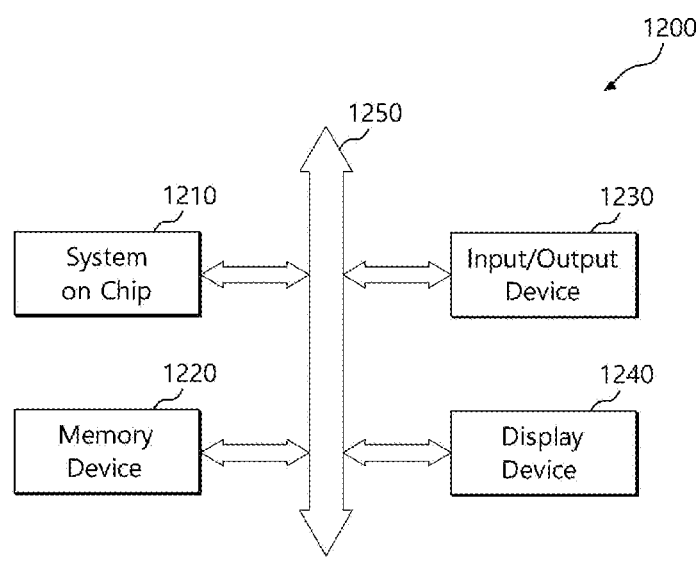
FIG. 20 is a block diagram illustrating an example of an electronic system including a chip-stacked package, according to an example embodiment of the inventive concepts.

FIG. 20 is a block diagram illustrating an example of an electronic system including a chip-stacked package, according to an example embodiment of the inventive concepts.

An SoC 1210 may be mounted on the electronic system 1200. The electronic system 1200 may be, for example, a mobile device, a desktop computer, or a server. The electronic system 1200 may include a memory device 1220, an input/output device 1230, and a display device 1240. The memory device 1220, the input/output device 1230, and the display device 1240 may electrically communicate with each other through a bus 1250. The SoC 1210 may be the stack chip package 100 of FIGS. 1 and 18. The memory device 1220 may be the stack chip package 100 of FIGS. 1 and 18. When the SoC 1210 including a main functional block having relatively high performance is mounted on the electronic system 1200, the electronic system 1200 may provide relatively high performance.

Figure 21:
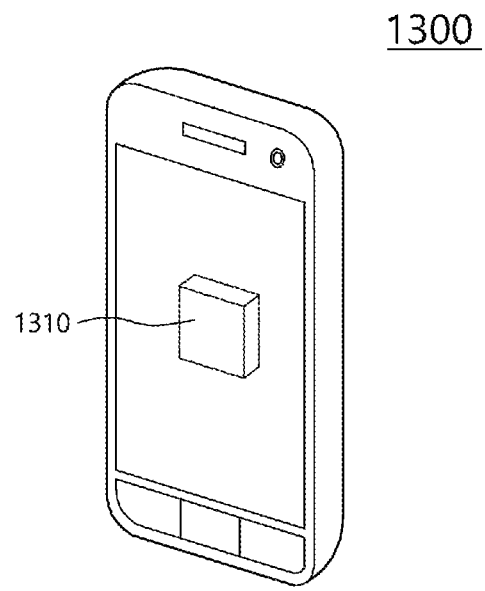
FIG. 21 is a perspective view illustrating an example of an electronic device including a chip-stacked package according to an example embodiment of the inventive concepts.

FIG. 21 is a perspective view illustrating an example of an electronic device including a chip-stacked package according to an example embodiment of the inventive concepts.

The electronic system 1200 of FIG. 20 may be applied to a mobile phone 1300. The mobile phone 1300 may include an SoC 1310. The SoC 1310 may be the stack chip package 100 of FIGS. 1 and 18.

When the mobile phone 1300 includes the SoC 1310 with a main functional block having relatively high performance, the mobile phone 1300 may provide relatively high performance.

Further, the electronic system 1200 may be applied to, for example, a portable notebook, an MP3 player, a navigation system, a solid-state drive (SSD), a vehicle, or a household appliance.

Figure 22:
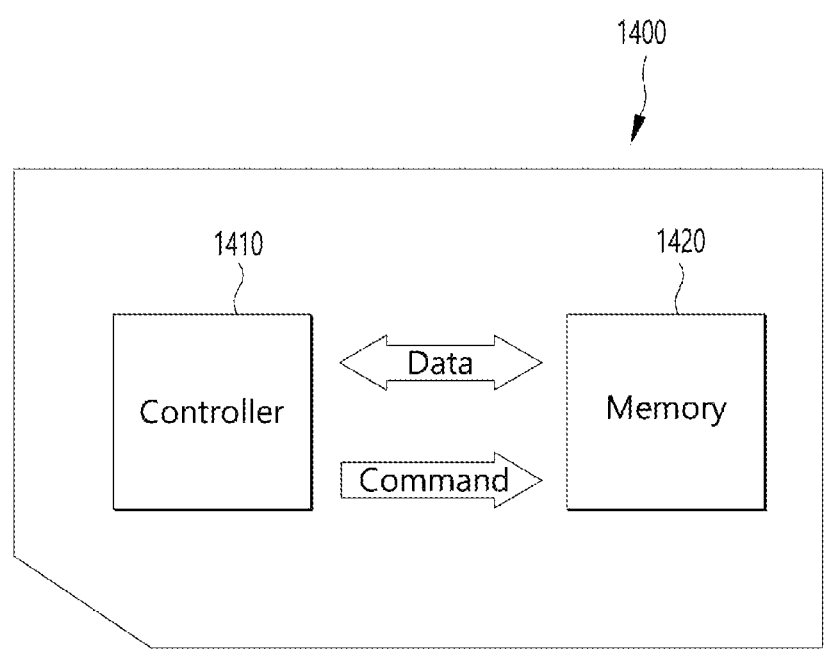
FIG. 22 is a block diagram illustrating examples of elements of a card using a chip-stacked package, according to an example embodiment of the inventive concepts.

FIG. 22 is a block diagram illustrating examples of elements of a card using a chip-stacked package, according to an example embodiment of the inventive concepts.

The chip-stacked packages 200 and 200-1 through 200-8 may be applied to the card 1400. Examples of a card 1400 may include, for example, a multimedia card (MMC) or a secure digital card (SD). The card 1400 may include a controller 1410 (e.g., a controller chip) and a memory 1420 (e.g., a memory chip). The memory 1420 may be, for example, a flash memory, a phase-change RAM (PCRAM), or any of other nonvolatile memories.

The controller 1410 may apply a control signal to the memory 1420 and data may be exchanged between the controller 1410 and the memory 1420. Each of the controller 1410 and the memory 1420 of the card 1400 may be the stack chip package 100 of FIGS. 1 and 18.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A stack chip package comprising:
   a plurality of sequentially stacked semiconductor chips, each of the semiconductor chips including first to fourth nodes corresponding to corners of the semiconductor chip,
   wherein the plurality of semiconductor chips are sequentially stacked such that, when a second semiconductor chip is disposed directly on a first semiconductor chip, the first node of the second semiconductor chip is positioned over a side between the first node and the second node of the first semiconductor chip,
   wherein the first node of the second semiconductor chip disposed on the first semiconductor chip is overlapped with the second node of the first semiconductor chip.

2. The stack chip package of claim 1, wherein the first semiconductor chip and the second semiconductor chip make an acute angle when viewed from above.

3. A stack chip package comprising:
   a plurality of sequentially stacked semiconductor chips; and
   a printed circuit board (PCB) electrically connected to the semiconductor chips,
   wherein each of the semiconductor chips includes a first short side, a second short side facing the first short side, a first long side, a second long side facing the first long side, and first to fourth nodes corresponding to intersection points between the first and second short sides and the first and second long sides, and
   wherein the plurality of semiconductor chips are sequentially stacked such that, when a semiconductor chip is disposed directly on another semiconductor chip, the first node of the semiconductor chip is positioned over the first short side between the first node and the second node of the another semiconductor chip,
   wherein the first node of the semiconductor chip is overlapped with the second node of the another semiconductor chip.

4. The stack chip package of claim 3, wherein at least two semiconductor chips are arranged in parallel to each other but with opposite alignments, and each of the at least two semiconductor chips has a region adjacent to the second short side of the respective semiconductor chip exposed from the other semiconductor chip of the at least two semiconductor chips.

5. The stack chip package of claim 4, wherein the PCB comprises contacts configured to make contact with the semiconductor chips.

6. The stack chip package of claim 5, wherein the number of contacts is the same or substantially the same as the number of the semiconductor chips.

7. The stack chip package of claim 5, wherein a height difference between adjacent contacts among the contacts is identical or similar to a thickness of the semiconductor chip.

8. The stack chip package of claim 5, wherein each of the contacts is electrically connected to the region adjacent to the second short side of the respective semiconductor chip.

9. The stack chip package of claim 8, wherein the contact is electrically connected to the region through an external connection terminal.

10. The stack chip package of claim 3, wherein, if the number of the semiconductor chips is n, the PCB has a columnar shape having n corners.

11. The stack chip package of claim 3, wherein the semiconductor chip and the another semiconductor chip make an acute angle when viewed from above.

12. A stack chip package comprising:
   a PCB; and
   first to eighth semiconductor chips sequentially stacked on the PCB,
   wherein each of the first to eighth semiconductor chips has a rectangular shape having a first short side, a second short side facing the first short side, a first long side, a second long side facing the first long side, and first to fourth nodes corresponding to intersection points between the first and second short sides and the first and second long sides,
   wherein the first to eighth semiconductor chips are sequentially stacked such that, when a semiconductor chip is disposed directly on another semiconductor chip, the first node of the semiconductor chip is positioned over the first short side between the first node and the second node of the another semiconductor chip, and
   wherein the PCB includes first to eighth contacts configured to make contact with the first to eighth semiconductor chips, respectively.

13. The stack chip package of claim 12, wherein the first semiconductor chip and the fifth semiconductor chip are arranged in parallel to each other but with opposite alignments, the second semiconductor chip and the sixth semiconductor chip are arranged in parallel to each other but with opposite alignments, the third semiconductor chip and the seventh semiconductor chip are arranged in parallel to each other but with opposite alignments, the fourth semiconductor chip and the eighth semiconductor chip are arranged in parallel to each other but with opposite alignments, the semiconductor chips arranged in parallel to each other but with opposite alignments have regions adjacent to the second short side of each semiconductor chip exposed from the other semiconductor chip of each pair of the semiconductor chips, and each of the exposed regions are electrically connected to one of the first to eighth contacts of the PCB.

14. The stack chip package of claim 12, wherein the PCB has an octagonal columnar shape having an octagonal bottom surface and eight side surfaces extending from the octagonal bottom surface.

15. The stack chip package of claim 14, wherein the first to eighth contacts are formed by inwardly bending upper surfaces of the side surfaces toward a central portion of the octagonal columnar shape.

16. The stack chip package of claim 15, wherein heights from the bottom surface of the PCB to the first to eighth contacts are gradually increased.

17. The stack chip package of claim 15, wherein the first to eighth contacts are electrically connected to the regions adjacent to the second short sides of the first to eighth semiconductor chips through conductive bumps.

18. A method of manufacturing a stack chip package, the method comprising:
   mounting a first semiconductor chip on a PCB, the first semiconductor chips including a first short side, a second short side facing the first short side, a first long side, a second long side facing the first long side and first to fourth nodes corresponding to intersection points between the first and second short sides and the first and second long sides; and
   stacking a second semiconductor chip on the first semiconductor chip, the second semiconductor chips including a first short side, a second short side facing the first short side, a first long side, a second long side facing the first long side and first to fourth nodes corresponding to intersection points between the first and second short sides and the first and second long sides,
   wherein the first node of the second semiconductor chip is overlapped with the second node of the first semiconductor chip.

* * * * *